US009178053B2

(12) United States Patent
Ciavatti et al.

(10) Patent No.: US 9,178,053 B2
(45) Date of Patent: Nov. 3, 2015

(54) TRANSISTOR DEVICE WITH IMPROVED SOURCE/DRAIN JUNCTION ARCHITECTURE AND METHODS OF MAKING SUCH A DEVICE

(71) Applicant: GLOBALFOUNDRIES Inc., Grand Cayman (KY)

(72) Inventors: Jerome Ciavatti, Hopewell Junction, NY (US); Johannes M. van Meer, Newburgh, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/579,122

(22) Filed: Dec. 22, 2014

(65) Prior Publication Data

US 2015/0108586 A1 Apr. 23, 2015

Related U.S. Application Data

(62) Division of application No. 13/927,932, filed on Jun. 26, 2013, now Pat. No. 8,962,441.

(51) Int. Cl.
*H01L 29/78* (2006.01)
*H01L 29/10* (2006.01)
*H01L 29/66* (2006.01)
*H01L 29/08* (2006.01)
*H01L 29/36* (2006.01)

(52) U.S. Cl.
CPC .......... *H01L 29/78* (2013.01); *H01L 29/0847* (2013.01); *H01L 29/1033* (2013.01); *H01L 29/36* (2013.01); *H01L 29/66492* (2013.01); *H01L 29/7833* (2013.01)

(58) Field of Classification Search
CPC ............... H01L 29/66545; H01L 29/66636; H01L 21/823807; H01L 29/6659; H01L 21/823412; H01L 29/665; H01L 21/26586; H01L 27/0207; H01L 21/823418; H01L 21/823828; H01L 21/31053
See application file for complete search history.

(56) References Cited

U.S. PATENT DOCUMENTS

| 5,395,773 | A |   | 3/1995  | Ravindhran et al. |
|-----------|---|---|---------|-------------------|
| 5,650,340 | A | * | 7/1997  | Burr et al. ............ 438/286 |
| 5,908,313 | A | * | 6/1999  | Chau et al. .......... 438/299 |
| 6,083,783 | A |   | 7/2000  | Lin et al. |
| 6,083,794 | A |   | 7/2000  | Hook et al. |
| 6,133,132 | A |   | 10/2000 | Toprac et al. |
| 6,348,387 | B1| * | 2/2002  | Yu ..................... 438/303 |
| 6,372,587 | B1|   | 4/2002  | Cheek et al. |
| 6,472,282 | B1| * | 10/2002 | Yu ..................... 438/305 |
| 6,614,079 | B2| * | 9/2003  | Lee et al. ............ 257/382 |
| 6,881,987 | B2|   | 4/2005  | Sohn |
| 7,002,214 | B1|   | 2/2006  | Boyd et al. |
| 7,144,782 | B1| * | 12/2006 | Ehrichs ............... 438/286 |
| 7,199,430 | B2|   | 4/2007  | Babcock et al. |

(Continued)

*Primary Examiner* — Thomas L Dickey
*Assistant Examiner* — Gustavo Ramallo
(74) *Attorney, Agent, or Firm* — Amerson Law Firm, PLLC

(57) ABSTRACT

One illustrative device disclosed herein includes a plurality of source/drain regions positioned in an active region on opposite sides of a gate structure, each of the source/drain regions having a lateral width in a gate length direction of the transistor and a plurality of halo regions, wherein each of the halo regions is positioned under a portion, but not all, of the lateral width of one of the plurality of source/drain regions. A method disclosed herein includes forming a plurality of halo implant regions in an active region, wherein an outer edge of each of the halo implant regions is laterally spaced apart from an adjacent inner edge of an isolation region.

12 Claims, 5 Drawing Sheets

(56) References Cited

U.S. PATENT DOCUMENTS

| | | | |
|---|---|---|---|
| 7,811,876 B2 * | 10/2010 | Scott et al. | 438/199 |
| 7,936,006 B1 * | 5/2011 | Luo et al. | 257/327 |
| 7,943,999 B2 | 5/2011 | Pei | |
| 8,314,463 B2 | 11/2012 | Cai et al. | |
| 2009/0108350 A1 * | 4/2009 | Cai et al. | 257/347 |
| 2009/0302388 A1 | 12/2009 | Cai et al. | |

* cited by examiner

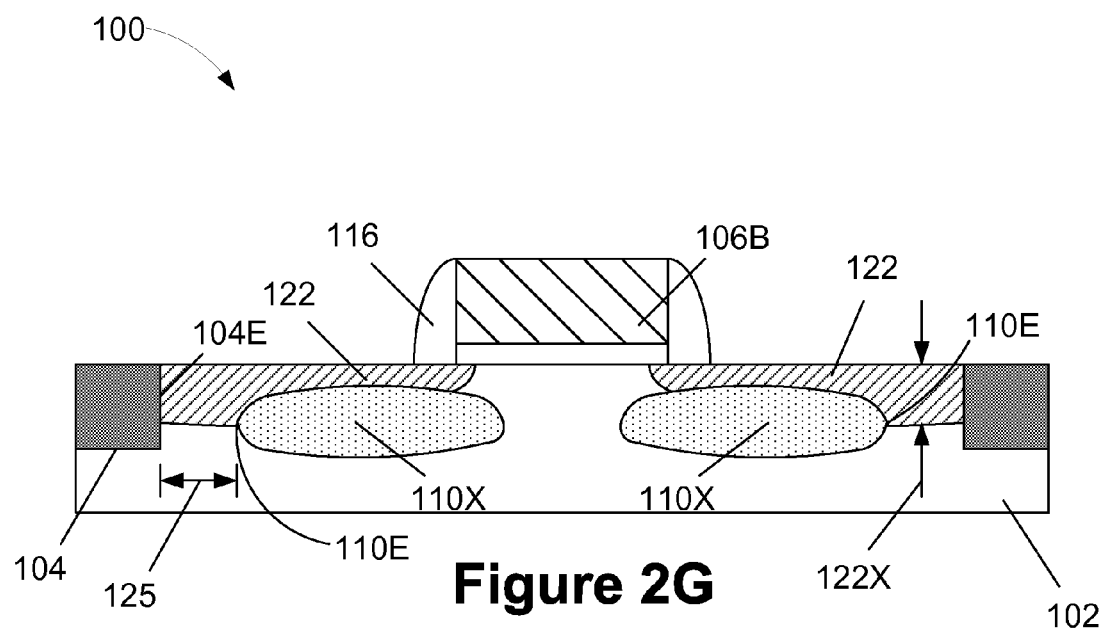

TRANSISTOR DEVICE WITH IMPROVED SOURCE/DRAIN JUNCTION ARCHITECTURE AND METHODS OF MAKING SUCH A DEVICE

CROSS-REFERENCE TO RELATED APPLICATION

This is a divisional of co-pending application Ser. No. 13/927,932, filed Jun. 26, 2013.

BACKGROUND OF THE INVENTION

1. Field of the Invention

Generally, the present disclosure relates to the manufacture of semiconductor devices, and, more specifically, to a transistor device with improved source/drain junction architecture and various methods of making such a device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element that substantially determines performance of the integrated circuits. During the fabrication of complex integrated circuits using, for instance, MOS technology, millions of transistors, e.g., NMOS transistors and/or PMOS transistors, are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped channel region disposed between the highly doped source/drain regions. Device designers are under constant pressure to improve the electrical performance characteristics of semiconductor devices, such as transistors, and the overall performance capabilities of integrated circuit devices that incorporate such devices.

Ion implantation is a technique that is employed in many technical fields to implant dopant ions into a substrate so as to alter the characteristics of the substrate or of a specified portion thereof. For example, the rapid development of advanced devices in the semiconductor industry is based on, among other things, the ability to generate highly complex dopant profiles within tiny regions of a semiconducting substrate by performing advanced implantation techniques through a masking. In implanting specified ions into a substrate, the desired lateral implant profile may be readily obtained by providing correspondingly adapted implantation masks. A desired vertical implant profile may be achieved by, among other things, controlling the acceleration energy of the ions during the implantation process such that the majority of the ions are positioned at a desired depth in the substrate. Moreover, by appropriately selecting the dopant dose, i.e., the number of ions per unit area of the ion beam impinging on a substrate, comparably high concentrations of atoms may be incorporated into a substrate as compared to other doping techniques, such as diffusion. In the case of an illustrative transistor, ion implantation may be used to form various doped regions, such as halo implant regions, extension implant regions and deep source/drain implant regions, etc.

An illustrative ion implantation sequence employed in forming an illustrative transistor 30 will now be discussed with reference to FIGS. 1A-1D. FIG. 1A depicts the transistor 30 at an early stage of fabrication, wherein a gate structure 14 has been formed above a semiconductor substrate 10 in an active region that is defined by a shallow trench isolation structure 12. The gate structure 14 typically includes a gate insulation layer 14A and a conductive gate electrode 14B. As shown in FIG. 1A, an implantation mask 17 is formed above the substrate so as to expose the transistor. The ion implantation mask 17 is typically a patterned layer of photoresist material and it may be formed using traditional photolithography tools and techniques. In one illustrative embodiment, a plurality of angled ion implantation processes are performed to form the schematically depicted so-called halo implant regions 15 in the substrate 10. The halo implant regions 15 are typically formed by performing a series of two or four angled implant processes, during which the substrate 10 is rotated 180° or 90° after each of the angled implantation processes is performed. The halo implant regions 15 are doped with the same type of dopant material as is the active region of the substrate 10. For example, for an NMOS device, the halo implant regions 15 may be P-doped regions so as to reinforce the dopants in the P-doped active region. In the case of a PMOS device, the halo implant regions 15 would be N-doped regions. The dopant concentration of the halo implant regions 15 may vary depending upon the particular application. The implant angle used in forming the halo implant regions 15 may also vary depending upon the particular application. Among other things, the purpose of the halo implant regions 15 is to reduce so-called short channel effects on minimum channel length devices, i.e., the proximity from the left and the right halo implant regions will help to avoid premature punch-through and keep the threshold voltage of the transistor device high enough for proper functionality.

As indicated in FIG. 1B, after the halo implant regions 15 are formed, a so-called extension ion implantation process is typically performed to form so-called extension implant regions 16 in the substrate 10. The extension implant process is typically performed through the same masking layer 17 that was used when forming the halo implant regions 15. In the case of an NMOS device, the extension implant regions will be N-doped regions. The concentration of dopant materials in the extension implant regions 16 may vary depending upon the particular application. In some embodiments, the extension implant regions 16 may be self-aligned relative to the sidewalls of the gate structure 14. In other applications, a small sidewall spacer (not shown) may be formed adjacent to the gate structure 14 prior to forming the extension implant regions 16. The extension implant regions 16 typically have a lower dopant concentration and a shallower depth than that of so-called deep source/drain implant regions that, as discussed more fully below, will be formed in the substrate 10.

FIG. 1C depicts the device 30 after several process operations have been performed. First, the patterned implant mask 17 used when performing the process operations described above in connection with FIGS. 1A-1B is removed. Then, one or more sidewall spacers 18 are formed proximate the gate structure 14. The spacers 18 may be formed by depositing a layer of spacer material and thereafter performing an anisotropic etching process. Next, a so-called source/drain doping process is performed on the transistor 30 by means of an epitaxy and/or ion implantation process to form so-called deep source/drain implant regions 20 in the substrate 10. As noted above, the source/drain ion implantation process is typically performed using a higher dopant dose and at a higher implant energy than the ion implantation process that was performed to form the extension implant regions 16. The halo implant regions 15 have a sufficient concentration of counter-dopant materials so as to effectively overwhelm the dopants implanted during the source/drain implantation process. As a result, the source/drain implant regions 20 effectively stop on the halo implant regions 15.

Thereafter, as shown in FIG. 1D, a heating or anneal process is performed to form the final source/drain regions 22 for the transistor 30. This heating process repairs the damage to the lattice structure of the substrate material as a result of the implantation processes and it activates the implanted dopant materials, i.e., the implanted dopant materials are incorporated into the silicon lattice. As depicted, the halo regions 15 limit the depth of the final source/drain regions 22. As device dimensions are continually being reduced, it is very important that the depth of the source/drain regions 22 for a transistor be very shallow, e.g., approximately 15 nm or less in current-day technologies, and that the implanted dopants are, to the extent possible, fully activated. Thus, heating processes such as a flash anneal or a laser anneal are performed for a very short duration, e.g., 1250° C. for a duration of 2-10 milliseconds, and are performed to limit the diffusion of the implanted ions, so as to maintain the desired shallow dopant profile, while at the same time trying to maximize dopant activation. In general, the higher the annealing temperature, the greater the extent of dopant activation. For previous device generations, a typical anneal process might be a rapid thermal anneal process performed at a temperature of about 1080° C. for a much longer duration of about 1-2 seconds. However, the very short millisecond anneal times performed to activate very shallow source/drain regions are insufficient to cure all of the damages to the substrate resulting from the ion implantation processes. After a flash or laser anneal process is performed, the source/drain regions 22 of the transistor 30 will have an amorphous region (where there is a sufficient concentration of ions to enable the region to conduct current) and a semi-amorphous region (where implanted ions are not of sufficient concentration or not activated). The depth of the amorphous regions may be approximately 3-7 nm and 40-50 nm, for the extension implant regions 16 and the deep source/drain implant regions 20, respectively, of the source/drain region 22 of the transistor 30. As a result, the depth of the semi-amorphous region would tend to overlap with the PN junction in the source/drain region of the device, which may result in higher leakage currents, which tend to reduce the electrical performance of the resulting device and an integrated circuit device incorporating such transistors.

The present disclosure is directed to a transistor device with improved source/drain architecture and various methods of making such a device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a transistor device with improved source/drain junction architecture and various methods of making such a device. In one example, a method disclosed herein includes forming an isolation region in the substrate so as to define an active region in the substrate, forming a gate structure above the active region and, after forming the gate structure, forming a plurality of halo implant regions in the active region, wherein an outer edge of each of the halo implant regions is laterally spaced apart from an adjacent inner edge of the isolation region.

Another illustrative method involves forming the isolation region in a substrate so as to define an active region in the substrate, forming a gate structure above the active region, after forming the gate structure, forming a patterned halo implantation mask that has an opening that exposes the gate structure and a portion, but not all, of the active region positioned between the gate structure and the isolation region, and performing a plurality of angled ion implantation processes through the patterned halo implantation mask to form a plurality of halo implant regions in the substrate.

Yet another illustrative method disclosed herein includes the steps of forming the isolation region in a substrate so as to define an active region in the substrate, forming the gate structure above the active region, after forming the gate structure, forming a patterned halo implantation mask that has an opening that exposes the gate structure and a portion, but not all, of the active region positioned between the gate structure and the isolation region, and performing a plurality of angled ion implantation processes through the patterned halo implantation mask to form a plurality of halo implant regions in the substrate, wherein an outer edge of each of the halo implant regions is laterally spaced apart from an adjacent inner edge of the isolation region. In this example, the method further includes performing an extension ion implantation process through the patterned halo implantation mask so as to form a plurality of extension implant regions in the substrate, wherein an outer edge of each of the extension implant regions is laterally spaced apart from an adjacent inner edge of the isolation region.

One illustrative device disclosed herein includes an isolation region positioned in the substrate so as to define an active region in the substrate, a gate structure positioned above the substrate, a plurality of source/drain regions positioned in the active region on opposite sides of the gate structure, each of the source/drain regions having a lateral width in a gate length direction of the transistor, and a plurality of halo regions positioned in the active region, wherein each of the halo regions is positioned under a portion, but not all, of the lateral width of one of the plurality of source/drain regions.

Another illustrative device disclosed herein includes an isolation region positioned in the substrate that defines an active region in the substrate, a gate structure positioned above the substrate, a plurality of source/drain regions positioned in the active region on opposite sides of the gate structure, wherein each of the source/drain regions extends to and contacts the isolation region, and a plurality of halo regions positioned in the active region, wherein each of the halo regions has an outer edge that does not extend to and contact the isolation region.

BRIEF DESCRIPTION OF THE DRAWINGS

The disclosure may be understood by reference to the following description taken in conjunction with the accompanying drawings, in which like reference numerals identify like elements, and in which:

FIGS. 2A-2G depict one illustrative example of a novel transistor device disclosed herein with improved source/drain junction architecture and an illustrative method of making such a device.

Figure 1A:
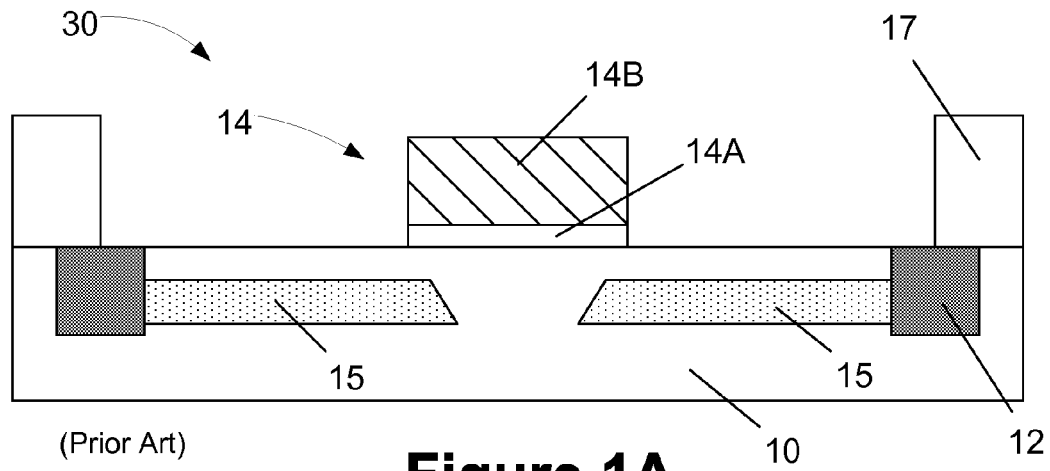
FIGS. 1A-1D depict one illustrative prior art process flow for forming doped halo and source/drain regions in a semiconductor device.
Figure 1B:
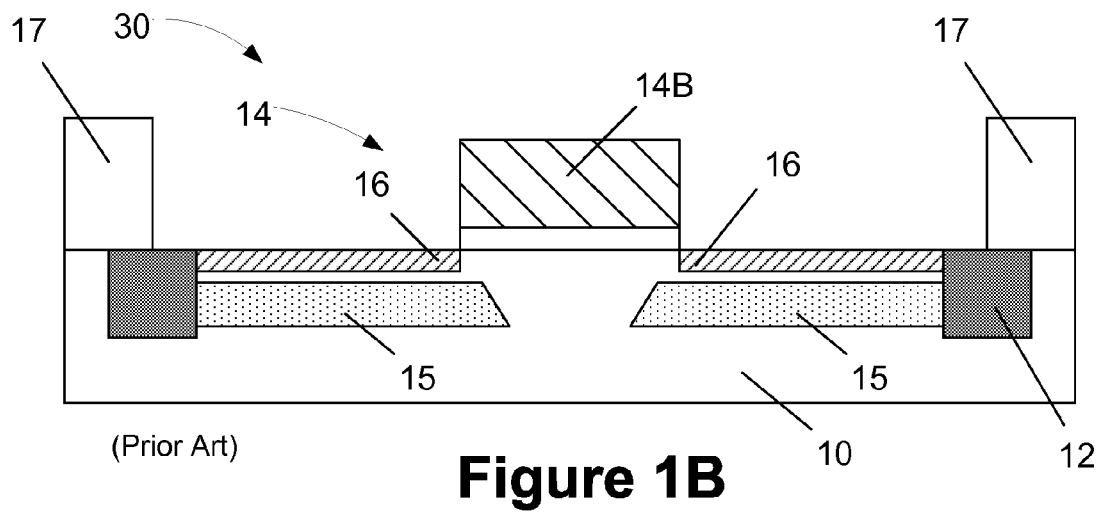
Figure 1C:
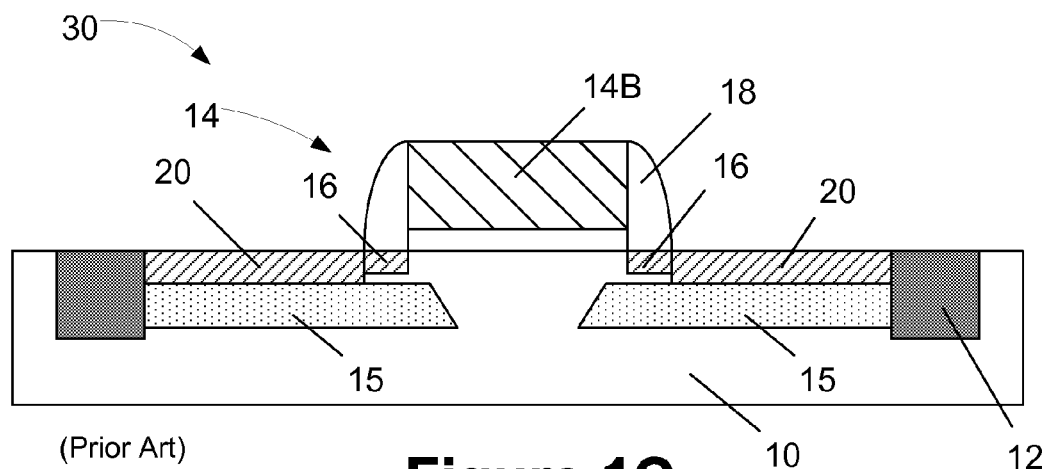
Figure 1D:
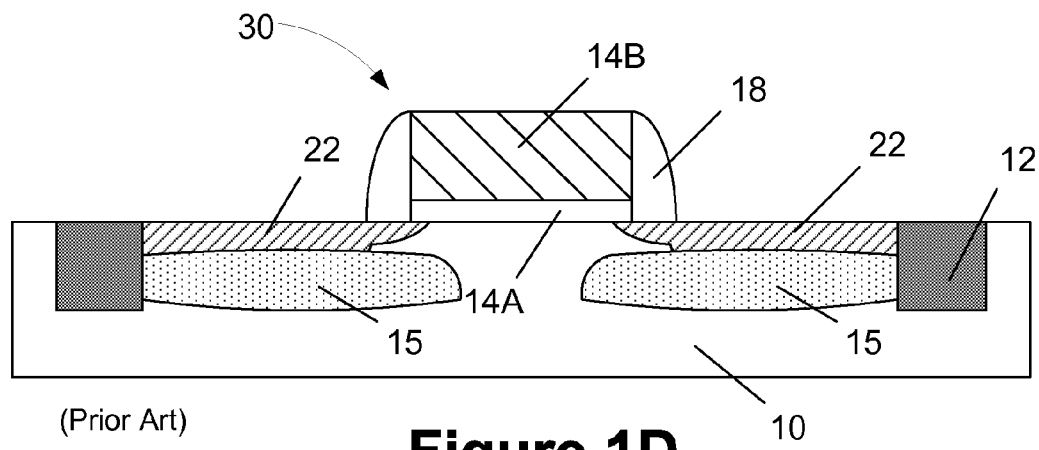

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a transistor device with improved source/drain junction architecture and various methods of making such a device. As will be readily apparent to those skilled in the art upon a complete reading of the present application, the present methods and systems are applicable to a variety of technologies, e.g., NMOS, PMOS, CMOS, etc., and they are readily applicable to a variety of devices, including, but not limited to, logic devices, memory devices, etc. With reference to the attached drawings, various illustrative embodiments of the methods and devices disclosed herein will now be described in more detail.

Figure 2A:
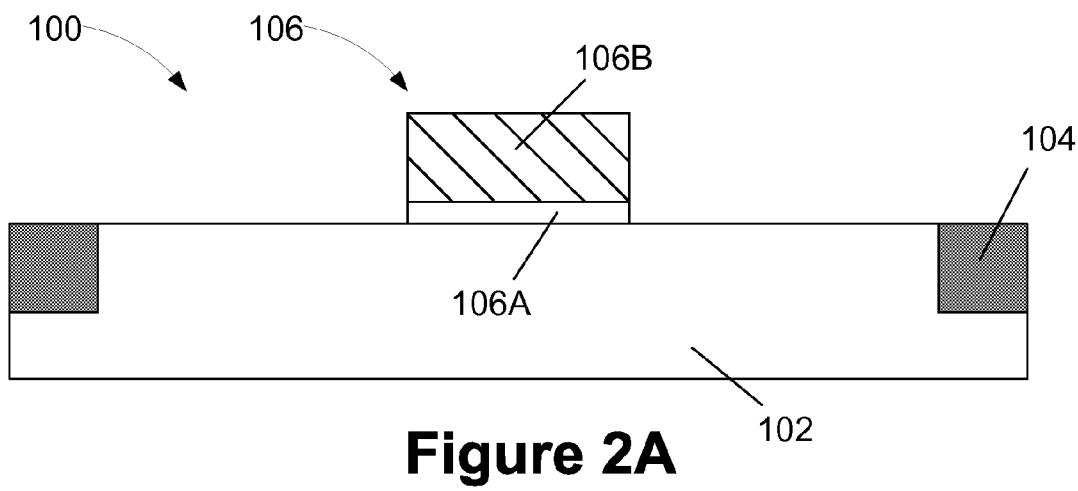

FIG. 2A depicts an illustrative transistor device 100 disclosed herein at an early stage of fabrication, wherein a gate structure 106 has been formed above a semiconductor substrate 102 in an active region that is defined by a shallow trench isolation structure 104. The gate structure 106 typically includes a gate insulation layer 106A and a conductive gate electrode 106B. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 102 may also be made of materials other than silicon. As will be recognized by those skilled in the art after a complete reading of the present application, the gate structure 106 may be of any desired construction and comprised of any of a variety of different materials, such as one or more conductive layers made of polysilicon or a metal, etc., and one or more layers of insulating material, such as silicon dioxide, a high-k material, etc. Additionally, the gate structure 106 for an NMOS transistor may have different material combinations as compared to a gate structure 106 for a PMOS transistor. Thus, the particular details of construction of gate structure 106, and the manner in which the gate structure 106 is formed, should not be considered a limitation of the present invention. For example, the gate structure 106 may be made using so-called "gate-first" or "gate-last" techniques.

The drawings below depict one illustrative process flow sequence in which halo implant regions, extension implant regions and deep source/drain regions are formed in that order using the novel methods disclosed herein. However, as will be appreciated by those skilled in the art after a complete reading of the present application, the halo and extension implantation processes may be performed in any desired order. Thus, the inventions disclosed herein should not be considered to be limited to any particular sequence of process operations unless such a sequence is expressly recited in the attached claims.

Figure 2B:
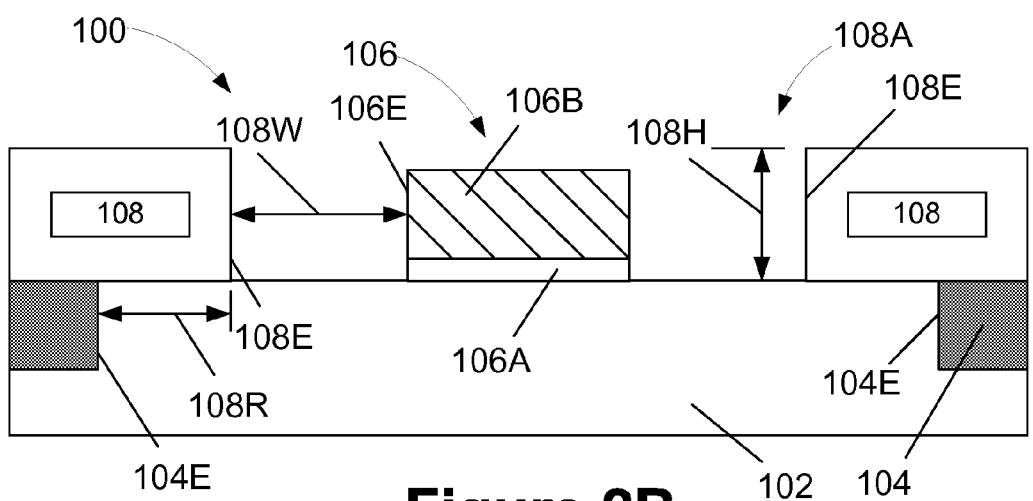

Next, as shown in FIG. 2B, a patterned halo ion implantation mask 108 is formed above the substrate 102. The halo ion implantation mask 108 is typically a patterned layer of photoresist material and it may be formed using traditional photolithography tools and techniques. Using the methods disclosed herein, the halo ion implantation mask 108 is formed such that it has an opening 108A that exposes a portion, but not all, of the active region between the gate structure 106 and the inner edges 104E of the isolation region 104. The height or thickness 108H of the halo ion implantation mask 108 may vary depending upon the particular application and the desired final width of the halo regions to be formed in the substrate 102, as discussed more fully below. In general, all other things being equal, as the height of the halo ion implantation mask 108 is increased, the width of the halo implant regions may be reduced. In one illustrative embodiment, the halo ion implantation mask 108 may have an overall height 108H that falls within the range of about 100-200 nm. Stated another way, the overall height of the halo ion implantation mask 108 may be about 80-180 nm taller than the height of the gate structure 106. The size of the space 108W between the inside edge 108E of the opening 108A in the halo ion implantation mask 108 and the corresponding edge 106E of the gate structure 106 may vary depending upon the particular application. In one illustrative embodiment, the size of the space 108W may be about 2-3 times the height of the gate structure 106. In absolute terms, the size of the space 108W may fall within the range of about 50-150 nm, depending upon the overall lateral width of the source/drain regions. Stated another way, the inner edge 108E of the opening 108A may be positioned inward of the inner edge 104E of the isolation region 104 by a distance 108R that falls within the range of about 20-4000 nm.

Figure 2C:
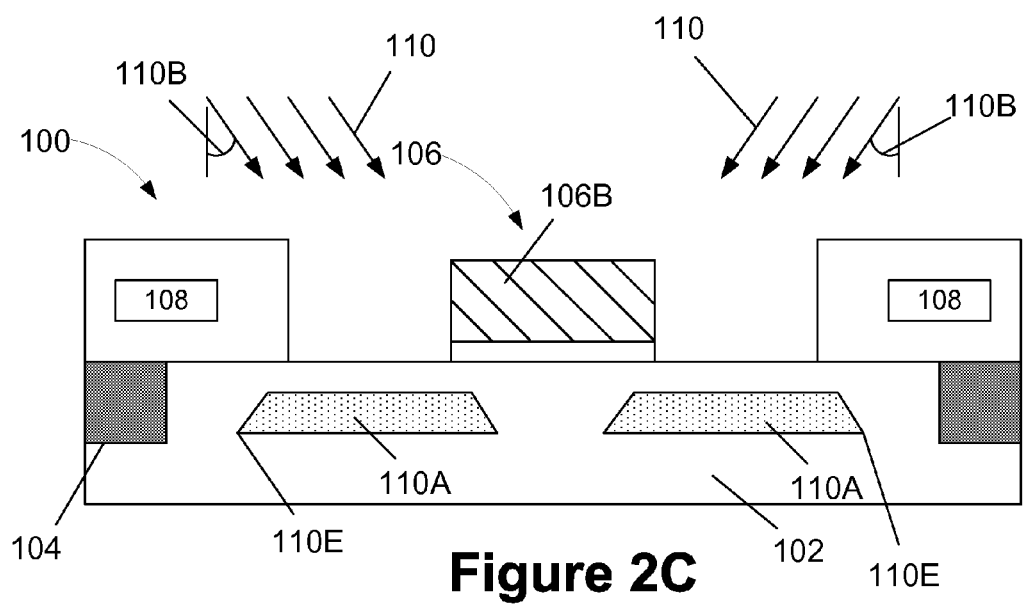

FIG. 2C depicts the device 100 after a plurality of angled halo ion implantation processes 110 are performed through the halo ion implantation mask 108 to form the schematically depicted halo implant regions 110A in the substrate 102. The halo implant regions 110A are typically formed by performing a series of two or four angled implant processes during which the substrate 102 is rotated 180° or 90°, respectively, after each of the angled implantation processes is performed. The halo implant regions 110A are doped with the same type of dopant material as is the active region of the substrate 102. For example, for an NMOS device, the halo implant regions 110A may be P-doped regions so as to reinforce the dopants in the P-doped active region. In the case of a PMOS device, the halo implant regions 110A would be N-doped regions. Stated another way, the halo implant regions 110A are doped with a dopant material that is opposite to the type of dopant material that is used to form the doped source/drain regions. The dopant dose used during the angled halo ion implantation processes 110 may vary depending upon the particular application, e.g., the dopant dose may fall within the range of about $5e^{12}$-$5e^{14}$ atoms/cm$^2$. The implant angle 110B used during the angled halo ion implantation processes 110 may also vary depending upon the particular application, i.e., the angle 110B may fall within the range of about 10-30 degrees. In one particular embodiment, the halo implant regions 110A may be formed by performing the angled halo ion implant processes 110 using a dopant dose of $5e^{12}$-$5e^{14}$ atoms/cm$^2$ and at an energy level of about 10-30 keV. In this illustrative example, the halo implant regions 110A may have at peak-concentration a target depth of about 7-30 nm.

Figure 2D:
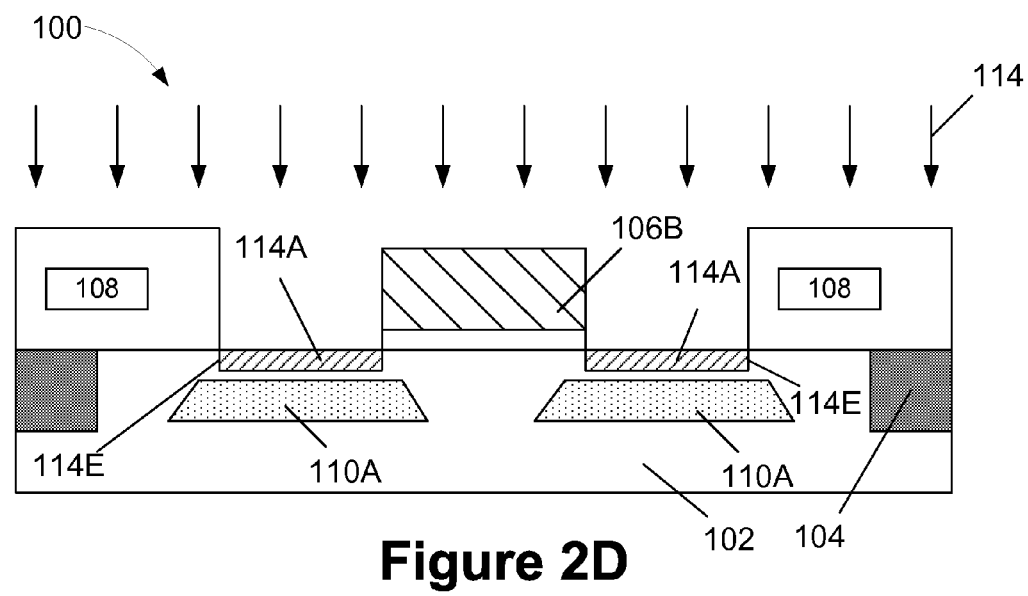

FIG. 2D depicts the device 100 after, in the illustrative processing sequence depicted herein, a substantially vertical, extension ion implantation process 114 is performed through the same halo implant mask 108 to form reduced-width extension implant regions 114A in the substrate 102. The extension implant regions 114A have a reduced width in the sense that the outer edge 114E of the extension implant regions 114A do not extend all of the way to the isolation region 104 as is common when performing extension implantation processes using prior art techniques. The reduced-width extension implant regions 114A are formed with a type of dopant that is opposite to the type of dopant used to form the halo implant regions 110A. For example, for an NMOS device, the extension implant regions 114A are N-doped regions. Conversely, for a PMOS device, the extension implant regions 114A would be P-doped regions. In this illustrative example, the extension ion implantation process 114 was performed using a dopant dose of $1$-$2e^{15}$ ions/cm$^2$ and at an energy level of about 2-5 keV. In this illustrative example, the extension implant regions 114 may have at peak-concentration a target depth of about 4-20 nm.

Figure 2E:
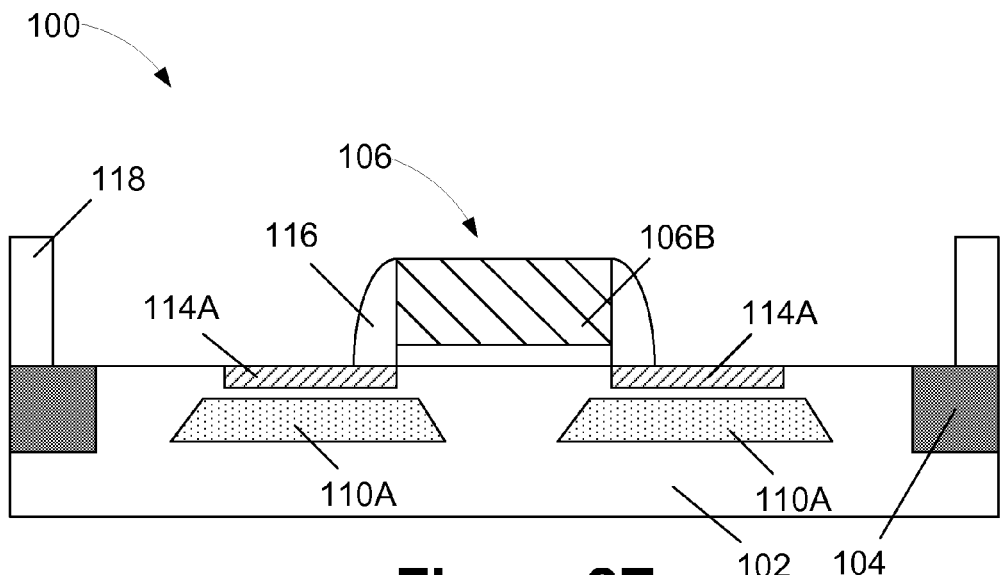

FIG. 2E depicts the device 100 after several process operations were performed. First, the halo ion implantation mask 108 was removed by performing, for example, an ashing process. Then, one or more sidewall spacers 116 were formed proximate the gate structure 106. The spacers 116 may be formed by depositing a layer(s) of spacer material and thereafter performing an anisotropic etching process. Thereafter, a patterned source/drain implantation mask 118 was formed above the device 100.

Figure 2F:
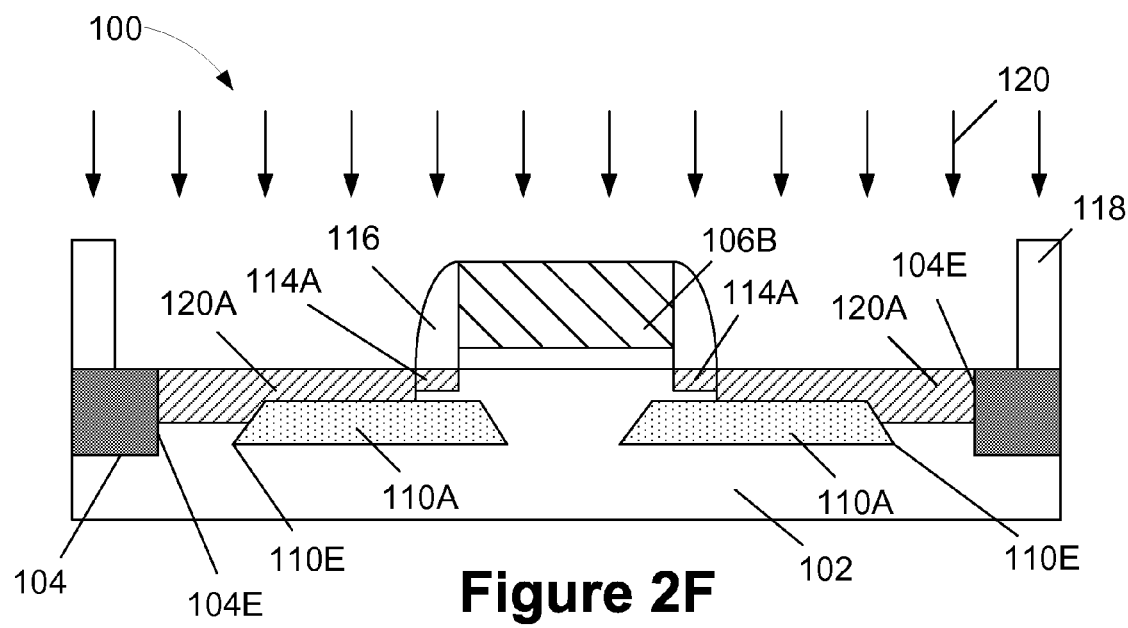

Next, as shown in FIG. 2F, a so-called source/drain ion implantation process 120 was performed on the device 100 to form so-called deep source/drain implant regions 120A in the substrate 102. As noted previously, the source/drain ion implantation process 120 is typically performed using a higher dopant dose and at a higher implant energy than the extension ion implantation process 110. The halo implant regions 110A have a sufficient concentration of counter-dopant materials so as to effectively overwhelm the dopants implanted during the source/drain implantation process 120. As a result, the source/drain implant regions 120A effectively stop on the halo implant regions 110A. However, as depicted in FIG. 2F, the portions of the source/drain implant regions 120A that are not located above the halo implant regions 110A effectively penetrate to a greater depth into the substrate 102. That is, the source/drain implant regions 120A positioned between the outermost edge 110E of the halo implant regions 110A and the inner edges 104E of the isolation region 104 has a greater depth than does the portions of the source/drain regions 120A that are positioned above the halo implant regions 110A, i.e., the junction depth is deeper where the halo implant regions 110A are absent. In this illustrative example, the deep source/drain ion implantation process 120 was performed using a dopant dose of 3-4 $e^{15}$ atoms/cm$^2$ and at an energy level of about 10-25 keV. In this illustrative example, the deep source/drain implant regions 120A may have at peak-concentration a target depth of about 50-60 nm.

FIG. 2G depicts the device 100 after several process operations have been performed. First, the patterned source/drain implantation mask 118 was removed by performing another ashing process. Then, a heating or anneal process is performed to repair the damage to the lattice structure of the substrate 102 as a result of the various implantation processes and it activates the implanted dopant materials. During the heating process, the implanted dopant materials tend to migrate or move to at least some degree so as to merge together to at least some extent. In the depicted example, the extension implant regions 114A and the deep source/drain implant regions 120A merge together to form final source/drain regions 122 for the device 100. The dopants implanted to form the halo implant regions 110A have migrated to form final halo regions 110X. The parameters of the heating process may vary depending on the particular application. In general, the heating process may be performed at a temperature in the range of about 800-1200° C. for a few milliseconds to a few seconds.

As will be appreciated by those skilled in the art after a complete reading of the present application, the device 100 depicted in FIG. 2G presents a novel source/drain junction architecture as compared to prior art devices. More specifically, in the device 100 depicted herein, the outer edge 110E of the halo implant regions 110A and the final halo regions 110X do not extend all the way to the inner edge 104E of the isolation region 104. That is, there is a space or region 125 (in the gate length direction) between the inner edge 104E of the isolation structure 104 and the outer edge 110E of the halo implant regions 110A and the final halo regions 110X. As a result, the junction depth 122X of the source/drain regions 122 that are positioned above this region 125 where the halo regions 110X are not present is greater than it would have been if the halo regions 110X extended all of the way to the inner edge 104E of the isolation region 104. Stated another way, the portions of the source/drain regions 120 positioned above the halo regions 110X have a shallower junction depth than the junction depth 122X of the portions of the source/drain regions 122 that are positioned above the region 125 where the halo regions 110X are not present. In one illustrative embodiment, the portions of the source/drain regions 122 positioned above the region 125 may have a junction depth that is about 10-25 nm greater than the junction depth of the portions of the source/drain regions 120 positioned above the halo regions 110X. The novel device disclosed herein may prove useful in many applications. For example, in the case where the device 100 has source/drain regions 122 that are very wide (in the channel length direction), e.g., a lateral width of about 200-4000 nm, the novel source/drain junction architecture disclosed herein permits the formation of source/drain regions 122 with deeper junction depths at distances that are spaced laterally far enough from the gate structure 106 while still providing the desired shallower junction depths for the source/drain regions 122 in areas that are closer to the gate structure 106, i.e., closer to the actual channel region of the device 100. Using the novel source/drain junction architecture disclosed herein, some of the leakage currents that would occur if the source/drain regions 122 had a substantially uniform shallow junction depth from the gate structure 106 to the isolation region 104 may be avoided by increasing the depth of the portion of the source/drain region 122 at the region 125 where the halo regions 110X are not present.

As will be appreciated by those skilled in the art after a complete reading of the present application, various novel methods and devices are disclosed herein. One illustrative method disclosed herein involves forming an isolation region 104 in the substrate 102 so as to define an active region in the substrate 102, forming a gate structure 106 above the active region and, after forming the gate structure 106, forming a plurality of halo implant regions 110A in the active region, wherein an outer edge 110E of each of the halo implant regions 110A is laterally spaced apart from an adjacent inner edge 104E of the isolation region 104.

Another illustrative method involves forming the isolation region 104 in the substrate 102 so as to define an active region in the substrate 102, forming a gate structure 106 above the active region, after forming the gate structure 106, forming a patterned halo implantation mask 108 that has an opening 108A that exposes the gate structure 106 and a portion, but not all, of the active region positioned between the gate structure 106 and the isolation region 104, and performing a plurality of angled ion implantation processes 110 through the patterned halo implantation mask 108 to form a plurality of halo implant regions 110A in the substrate 102.

Yet another illustrative method disclosed herein includes the steps of forming the isolation region 104 in a substrate 102 so as to define an active region in the substrate 102, forming the gate structure 106 above the active region, after forming the gate structure 106, forming a patterned halo implantation mask 108 that has an opening 108A that exposes the gate structure 106 and a portion, but not all, of the active region positioned between the gate structure 106 and the isolation region 104, and performing a plurality of angled ion implantation processes 110 through the patterned halo implantation mask 108 to form a plurality of halo implant regions 110A in the substrate 102, wherein an outer edge 110E of each of the halo implant regions 110 is laterally spaced apart from an adjacent inner edge 104E of the isolation region 104. In this example, the method further includes performing an extension ion implantation process 114 through the patterned halo implantation mask 108 so as to form a plurality of extension implant regions 114A in the substrate 102, wherein an outer edge 114E of each of the extension implant regions is laterally spaced apart from an adjacent inner edge 104E of the isolation region 104. Stated another way, each of the extension implant regions 114A has first and second portions, and wherein the first portion is positioned above a corresponding halo implant region 110A and the second portion is positioned adjacent the isolation region 104 and above a portion of the active region where the corresponding halo implant region 110A is absent.

The subject matter disclosed herein is also directed to various embodiments of a transistor device. In one example, such a device includes an isolation region 104 positioned in the substrate 102 so as to define an active region in the substrate 102, a gate structure 106 positioned above the substrate 102, a plurality of source/drain regions 122 positioned in the active region on opposite sides of the gate structure 106, each of the source/drain regions having a lateral width in a gate length direction of the transistor, and a plurality of halo regions 110X positioned in the active region, wherein each of the halo regions 110X is positioned under a portion, but not all, of the lateral width of one of the plurality of source/drain regions 122.

Another illustrative device disclosed herein includes an isolation region 104 positioned in the substrate that defines an active region in the substrate, a gate structure 106 positioned above the substrate 102, a plurality of source/drain regions 122 positioned in the active region on opposite sides of the gate structure 122, wherein each of the source/drain regions extends to and contacts the isolation region 104, and a plurality of halo regions 110X positioned in the active region, wherein each of the halo regions 110X has an outer edge 110E that does not extend to and contact the isolation region 104.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A transistor device, comprising:
an isolation region positioned in a semiconductor substrate that defines an active region in said substrate;
a gate structure positioned above said substrate;
a plurality of source/drain regions positioned in said active region on opposite sides of said gate structure, each of said source/drain regions having first and second portions, wherein said second portions extend to and contact said isolation region and wherein said first portion has a first junction depth relative to an upper surface of said active region and said second portion has a second junction depth relative to said upper surface of said active region, said second junction depth being greater than said first junction depth; and
a plurality of halo regions positioned in said active region, wherein each of said halo regions has an outer edge that is spaced apart from an inner surface of said isolation region and defines a space within said active region that is free of said halo region, wherein, for each of said source/drain regions, said first portion is vertically located above one of said halo regions and said second portion is located above one of said spaces within said active region that is free of said halo regions, and wherein a deepest portion of each of said halo regions extends to a depth below said upper surface of said active region that is greater than a deepest portion of a respective one of said source/drain regions.

2. A transistor device, comprising:
an isolation region positioned in a semiconductor substrate that defines an active region in said substrate;
a gate structure positioned above said substrate;
a plurality of source/drain regions positioned in said active region on opposite sides of said gate structure, each of said source/drain regions having a lateral width in a gate length direction of said transistor; and
a plurality of halo regions positioned in said active region, wherein each of said halo regions is positioned under a portion, but not all, of said lateral width of one of said plurality of source/drain regions, and wherein a deepest portion of each of said halo regions extends to a depth below an upper surface of said active region that is greater than a deepest portion of a respective one of said source/drain regions.

3. The device of claim 2, wherein an outer edge of each of said halo regions is spaced apart from an inner surface of said isolation region and defines a space within said active region that is free of said halo region.

4. The device of claim 3, wherein each of said plurality of source/drain regions has first and second portions, wherein said first portion is vertically located above said halo region and said second portion is located above said space within said active region that is free of said halo region.

5. The device of claim 4, wherein said first portion has a first junction depth relative to said upper surface of said active region and said second portion has a second junction depth relative to said upper surface of said active region, said second junction depth being greater than said first junction depth.

6. The device of claim 4, wherein said second portion of each of said plurality of source/drain regions contacts said isolation region.

7. The device of claim 2, wherein an outer edge of each of said plurality of halo regions does not contact said isolation region.

8. The device of claim 2, wherein said source/drain regions are doped with a first type of dopant material and said halo regions are doped with a second type of dopant material that is opposite to said first type of dopant material.

9. A transistor device, comprising:
an isolation region positioned in a semiconductor substrate that defines an active region in said substrate;
a gate structure positioned above said substrate;
a plurality of source/drain regions positioned in said active region on opposite sides of said gate structure, each of said source/drain regions comprising an extension portion positioned adjacent to and below a respective side of said gate structure and a deep portion extending to and contacting said isolation region, a deepest part of said deep portion extending to a first depth below an upper surface of said active region that is greater than a depth of said extension portion; and
a plurality of halo regions positioned in said active region, wherein each of said halo regions extends to a second depth below said upper surface of said active region that is greater than said first depth and has an outer edge that does not extend to and contact said isolation region.

10. The device of claim 9, wherein said outer edge of each of said halo regions is spaced apart from an inner surface of said isolation region and defines a space within said active region that is free of said halo region.

11. The device of claim 10, wherein said extension portion is vertically located above said halo region and said deep portion is located above said space within said active region that is free of said halo region.

12. The device of claim 11, wherein said extension portion has a first junction depth relative to said upper surface of said active region and said deep portion has a second junction depth relative to said upper surface of said active region, said second junction depth being greater than said first junction depth.

* * * * *